US008466555B2

(12) United States Patent  (10) Patent No.: US 8,466,555 B2
Chelakara et al.  (45) Date of Patent: Jun. 18, 2013

(54) GOLD-FREE OHMIC CONTACTS

(75) Inventors: Ram V. Chelakara, Burlington, MA (US); Thomas E. Kazior, Sudbury, MA (US); Jeffrey R. LaRoche, Lowell, MA (US)

(73) Assignee: Raytheon Company, Waltham, MA (US)

( * ) Notice: Subject to any disclaimer, the term of this patent is extended or adjusted under 35 U.S.C. 154(b) by 63 days.

(21) Appl. No.: 13/152,481

(22) Filed: Jun. 3, 2011

(65) Prior Publication Data

US 2012/0305931 A1  Dec. 6, 2012

(51) Int. Cl.
*H01L 23/48* (2006.01)

(52) U.S. Cl.
USPC .......... 257/745; 257/382; 257/383; 257/576; 257/624; 257/768

(58) Field of Classification Search
USPC ................ 257/382–383, 388, 412, 576, 624, 257/768, E29.143, E21.045–E21.046, E21.061–E21.062
See application file for complete search history.

(56) References Cited

U.S. PATENT DOCUMENTS 5,389,564 A  2/1995  Bernhardt et al.
6,858,522 B1  2/2005  Burton et al.

FOREIGN PATENT DOCUMENTS

EP  0 649 167 A2  4/1995
EP  0 649 167 A3  4/1995

OTHER PUBLICATIONS

Il-Ho Kim, Pd/Si/Ti/Pt ohmic contact to n-type InGaAs for AlGaAs/GaAs HBT, Nov. 8, 2002, Materials Letters and Elsevier Science, Material letters 57, pp. 2769-2775.*

M. Feng, R. K Price, R. Chan, T. Chung, R. D. Dupuis, D. M. Keogh, J. C. Li, A. M. Conway, D. Quiao, S. Raychaudhuri and P. M. Asbeck, Current status of GaN Heterojunction Bipolar Transistor, 2004, IEEE, pp. 26-31.*

Fitih M. Mohammed, Liang Wang, and LLesanmi Adesida, Noninterfacial-nitride formation ohmic contact mechanism in Si-containing Ti/Al/Mo/Au metallizations on AlGaN/GaN heterostructures, Dec. 23, 2005, Applied Physics Letters 87, 262111.*

Mike Cooke, Making III-V contact with silicon substrate, Apr./May 2011, Semiconductor Today Compounds & Advanced Silicon, vol. 6, Issue 3.*

Kim et al., "Current Conduction Mechanism of Si/Ti-based Ohmic Contacts to *n*-GaN", Applied Physics Letters, vol. 77, No. 7, Aug. 14, 2000, 3 pages.

Mohammed et al., "Noninterfacial-Nitride Formation Ohmic Contact Mechanism in Si-Containing Ti/Al/Mo/Au Metallizations on AlGaN/GaN Heterostructures", Applied Physics Letters 87, 262111 (2005), 3 pages.

(Continued)

*Primary Examiner* — Steven Loke
*Assistant Examiner* — Cuong Nguyen
(74) *Attorney, Agent, or Firm* — Daly, Crowley, Mofford & Durkee, LLP

(57) ABSTRACT

A semiconductor structure is provided having: a semiconductor; a gold-free electrically conductive structure in ohmic contact with the semiconductor; and a pair of electrically conductive layers separated by a layer of silicon. The structure includes: a refractory metal layer disposed in contact with the semiconductor; and wherein one of the pair of electrically conductive layers separated by the layer of silicon is the refractory metal layer. A second layer of silicon is disposed on a second one of the pair of pair of electrically conductive layers and including a third electrically conducive layer on the second layer of silicon. In one embodiment, the semiconductor includes a III-V material.

11 Claims, 1 Drawing Sheet

OTHER PUBLICATIONS

Mohammed et al., "Ultralow Resistance Si-Containing Ti/Al/Mo/Au Ohmic Contacts With Large Processing Window for AlGaN/GaN Heterostructures", Applied Physics Letters 88, 212107 (2006), 3 pages.

Chin et al.; "In Situ Surface Passivation and CMOS-Compatible Palladium-Germanium Contacts for Surface-Channel Gallum Arsenide MOSFETS," IEEE Electronic Device Letters, vol. 29, No. 6; Jun. 2008; pp. 553-556.

Grenouillet et al.; "CMOS Compatible Contacts and Etching for InP-on-Silicon Active Devices;" 6$^{th}$ IEEE International Conference of Group IV Photonics; Sep. 9, 2009; ISBN: 978-1-4244-4403; pp. 196-198.

PCT Search Report and Written Opinion of the ISA dated Aug. 21, 2012; for PCT Pat. App. No. PCT/US2012/038497; 8 pages.

Ti/Al/Mo/Au Ohmic contacts to all-binary AIN/GaN high electron mobility transistors. Liang Wang, et al. Applied Physics Letters 93, 032109 (2008), pages.

* cited by examiner

GOLD-FREE OHMIC CONTACTS

TECHNICAL FIELD

This disclosure relates generally to ohmic electrical contacts for semiconductor devices and more particularly to ohmic contacts free of gold.

BACKGROUND

As is known in the art, AlGaN/GAN high electron mobility transistors (HEMTs) are increasingly being used for applications requiring high-frequency, and high-power. In order to realize the potential of these HEMT devices, it is necessary to achieve low-resistance, good edge acuity and reliable ohmic contacts. Most low resistance ohmic contacts used in devices use Au as the top layer to reduce sheet resistance and decrease oxidation during the high temperature anneal needed to achieve the lowest specific contact resistivity.

The presence of Au in a silicon manufacturing facility can be a serious contamination concern that can cause catastrophic yield problems. For applications requiring processing of GaN device wafers in environments that require Au-free processes such as in CMOS silicon fabs, Au contamination is a serious concern.

SUMMARY

In accordance with the present disclosure, a device is provided having a III-V semiconductor; and a gold-free electrically conductive structure in ohmic contact with the semiconductor.

In accordance with the present disclosure, a semiconductor structure is provided having: a semiconductor; a gold-free electrically conductive structure in ohmic contact with the semiconductor; and a pair of electrically conductive layers separated by a layer of silicon, or with a one or both of the pair of electrically conductive layers alloyed with the silicon layer.

In one embodiment, the electrically conductive structure includes: a refractory metal layer disposed in contact with the semiconductor; and wherein one of the pair of electrically conductive layers separated by or alloyed with the layer of silicon is the refractory metal layer.

In one embodiment, a second layer of silicon is disposed on a second one of the pair of pair of electrically conductive layers and including a third electrically conducive layer on or alloyed with the second layer of silicon.

In one embodiment, a semiconductor structure is provided having: a semiconductor;
a electrically conductive structure in ohmic contact with the semiconductor. The structure includes: a first metal layer in ohmic contact with semiconductor; a layer of silicon in contact or alloyed with the first metal layer; and a second metal layer in contact or alloyed with the layer of silicon.

In one embodiment, the semiconductor includes a III-V material.

In one embodiment, the semiconductor includes GaN.

In one embodiment, the first metal layer is a refractory metal.

In one embodiment, the second metal layer is aluminum.

In one embodiment, a second layer of silicon in contact with the second metal layer.

In one embodiment, a third metal layer is in contact or alloyed with the second layer of silicon.

In one embodiment, the third metal layer is platinum.

With such structures, an Au-free ohmic contact metallization that is crucial for use in Si fabs and hence enables heterogeneous integration of GaN on Si wafers to be manufactured in a Si foundry. The electrical contact has good ohmic contact resistance. Further the contact is relatively low in cost since it avoids use of Au, a precious metal.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
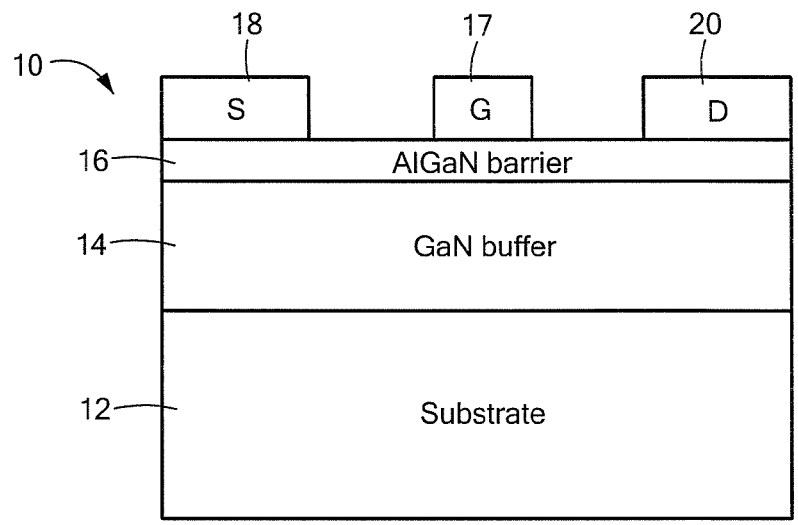
FIG. 1 is a diagram of a transistor device having electrical contacts in accordance with the disclosure.
Figure 2:
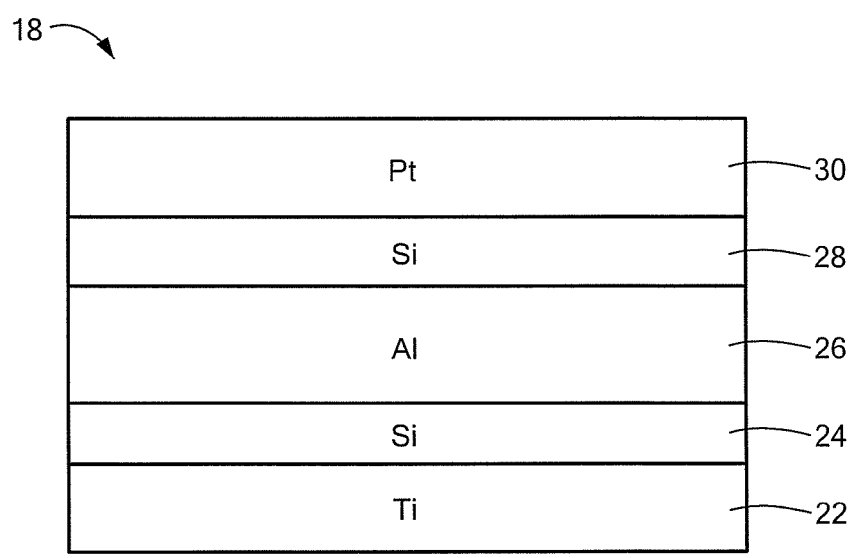
FIG. 2 is an enlarged diagram of an exemplary one of the electrical contacts in the transistor device of FIG. 1.

Referring now to FIG. 1, a transistor device 10, here for example, an AlGaN/GaN High Electron Mobility Transistor (HEMT) structure is shown. Here, the transistor device 10 is formed on a wafer having a single crystal substrate 12, a GaN buffer layer 14 on the substrate 12, and a semiconductor layer 16 on the GaN layer 14, as shown, The transistor device 10 has a gate electrode 17, and source and drain electrodes 18, 20, respectively. The source and drain electrodes 18, 20 gold-free electrical contacts and are both in ohmic contact with the semiconductor layer 16, here layer 16 is a III-V AlGaN layer. The source and drain electrodes 18, 20 are identical in construction; an exemplary one thereof, here the source contact 18 being shown in more detail in FIG. 2.

The source or drain contact is an electrically conductive structure in ohmic contact with the semiconductor layer 16 and includes: a refractory metal layer 22, here layer of titanium having a thickness in the range of 200 A, in contact with semiconductor layer 16; a layer 24 of silicon having a thickness in the range of 100 A-200 A on the refractor metal layer 22; an electrically conducive layer 26 of, here for example aluminum, here having a thickness of 1200 A in contact with the layer 24 of silicon; a layer 28 of silicon having a thickness in the range of 100 A-200 A on the aluminum layer 26; and an electrically conductive layer 30 of, here for example platinum, here having a thickness of 300 A in contact with the layer 26 of silicon.

The source or drain electrodes 18, 20 are here for example formed by electron beam evaporation on the GaN/GaN HEMT wafer. The wafer is then alloyed in a nitrogen ambient at a specific alloying temperature to form low-resistance interlayers that lowers the contact resistance.

A number of embodiments of the disclosure have been described. Nevertheless, it will be understood that various modifications may be made without departing from the spirit and scope of the disclosure. For example, it should be understood that as a result of using the structure, the layers therein may alloy one with another so that the resulting structure may include an alloy of silicon and titanium, an alloy of silicon and aluminum, and/or an alloy of silicon and platinum. Accordingly, other embodiments are within the scope of the following claims.

What is claimed is:

1. A semiconductor structure, comprising:
a nitride semiconductor;
a gold-free conductive structure in ohmic contact with the nitride semiconductor, comprising:
a refractory metal layer in direct contact with the nitride semiconductor;
a first layer of silicon disposed on the refractory metal layer;

an electrically conductive layer in contact with the layer of silicon;

a second layer of silicon on the electrically conductive layer; and a layer of platinum on the second layer of silicon.

2. The semiconductor structure recited in claim 1 wherein the refractory metal is titanium.

3. The semiconductor structure recited in claim 2 wherein the electrically conductive layer is aluminum.

4. The semiconductor structure recited in claim 2 wherein titanium having a thickness in a range of 200 Å.

5. The semiconductor structure recited in claim 4 wherein the first silicon layer has a thickness in a range of 100 Å-200 Å.

6. The semiconductor structure recited in claim 5 wherein the electrically conductive layer is aluminum.

7. The semiconductor structure recited in claim 6 wherein the second silicon layer has a thickness in a range of 100 Å-200 Å.

8. The semiconductor structure recited in claim 1 wherein the nitride semiconductor comprises GaN.

9. The semiconductor structure recited in claim 2 wherein the nitride semiconductor comprises GaN.

10. The semiconductor structure recited in claim 3 wherein the nitride semiconductor comprises GaN.

11. The semiconductor structure recited in claim 1 wherein the nitride semiconductor is undoped.

\* \* \* \* \*